United States Patent
Howell et al.

(10) Patent No.: US 6,547,609 B2
(45) Date of Patent: Apr. 15, 2003

(54) VACUUM PICK UP CAP FOR USING IN SOCKET

(75) Inventors: David G. Howell, Gilbert, AZ (US); Sung-Pei Hou, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/909,584

(22) Filed: Jul. 20, 2001

(65) Prior Publication Data
US 2003/0017725 A1 Jan. 23, 2003

(51) Int. Cl.[7] .................... H01R 9/22; H01R 13/73; H01R 13/60
(52) U.S. Cl. .............................. 439/940; 439/41
(58) Field of Search ..................... 439/41, 940, 135, 439/149

(56) References Cited

U.S. PATENT DOCUMENTS 5,613,864 A * 3/1997 Northey ............... 439/149
5,681,174 A * 10/1997 Correll, Jr. et al. ......... 439/135
5,688,140 A * 11/1997 McHugh et al. ............ 439/331
5,810,611 A * 9/1998 Campagnon ............... 439/149
5,899,760 A * 5/1999 Ho et al. ................... 439/135
5,910,023 A * 6/1999 McHugh et al. ............. 439/41
6,210,198 B1 * 4/2001 McHugh et al. ............ 439/342
6,220,882 B1 * 4/2001 Simmel et al. ............. 439/326

* cited by examiner

Primary Examiner—Lynn Field
Assistant Examiner—Chandrika Prasad
(74) Attorney, Agent, or Firm—Wei Te Chung

(57) ABSTRACT

Disclosed is a vacuum pick up cap (10) for use in transporting by vacuum suction a socket (12) is provided. The socket includes a base (14) having an opening (20), and a cover (16) having a through-hole (22) and slidably stacked on an upper surface of the base to moveable between an open position and a closed position. The pick up cap has a flat surface and a leg (24). In the open position, the leg extends through the through-hole and into the opening. In the closed position, the leg is retained in the opening by a periphery of the through-hole.

10 Claims, 4 Drawing Sheets

VACUUM PICK UP CAP FOR USING IN SOCKET

BACKGROUND OF THE INVENTION

1. Field of the Invention

The present invention relates to a cap, and particularly to a vacuum pick up cap for using in socket to facilitate operation.

2. Description of Related Art

Generally, a chip module socket, such as CPU socket, has a small fixing base surface because of multiples of through-holes. In order to position the CPU socket on a printed circuit board (hereinafter PCB), one skilled in the art need put a pick up cap (see FIG. 6) on the CPU socket. Consequently, the pick up cap is sucked and carried by a vacuum device, thereby carrying the CPU socket. Finally, the CPU socket can be accurately located on the PCB. The pick up cap 2 has an upper surface 4, a bottom surface 6, and a series of protrusions 8 projecting from the bottom surface. The protrusions can interference fit in a corresponding aperture defined in the CPU socket.

However, because of inherent tolerance of the aperture of the CPU socket and the protrusions, there may happen that the protrusions cannot be inserted through the aperture. On the other hand, excessive interference between the aperture and the protrusions may result in damage of the aperture.

SUMMARY OF THE INVENTION

Accordingly, the object of the present invention is to provide a vacuum pick up cap which can be easily and reliably assembled to a CPU socket.

In order to achieve the object set forth, a vacuum pick up cap for use in transporting by vacuum suction a socket is provided. The socket includes a base having an opening, and a cover having a through-hole and slidably stacked on an upper surface of the base to moveable between an open position and a closed position. The pick up cap has a flat surface and a leg. In the open position, the leg extends through the through-hole and into the opening. In the closed position, the leg is retained in the opening by a periphery of the through-hole. Thus, such a pick up cap may be freely, i.e., zero insertion force (ZIF), initially mounted to the socket and successively locked thereto. The withdrawal of the pick up cap from the socket also achieves the zero force thereof.

Other objects, advantages and novel features of the invention will become more apparent from the following detailed description when taken in conjunction with the accompanying drawings.

DETAILED DESCRIPTION OF THE INVENTION

Figure 1:
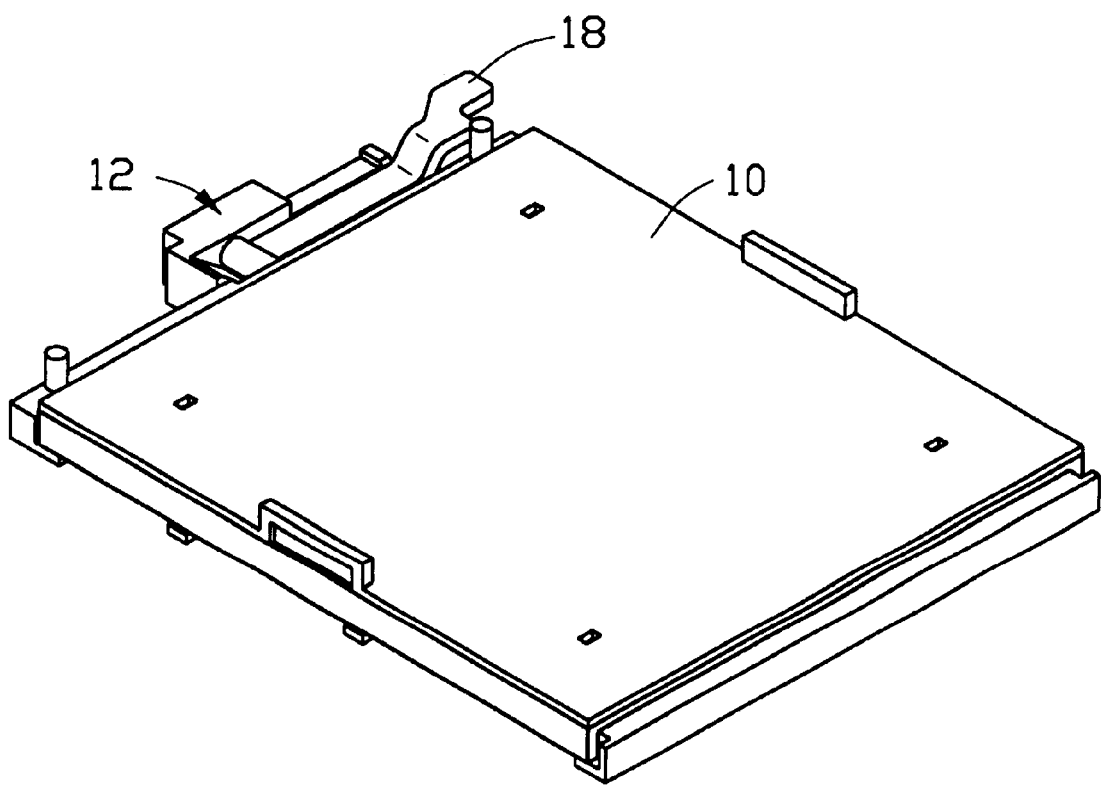
FIG. 1 is a perspective view of a vacuum pick up cap in accordance with the present invention assembled on a CPU socket.

Reference will now be made to the drawing figures to describe the present invention in detail.

Referring to FIG. 1, a vacuum pick up cap 10 of the present invention is used for sucking a corresponding CPU socket 12 by a vacuum device (not shown). In use, the CPU socket needs to be placed on a selected position of a PCB to establish an electrical connection between the contacts (not shown) of the CPU socket and the PCB.

Figure 3:
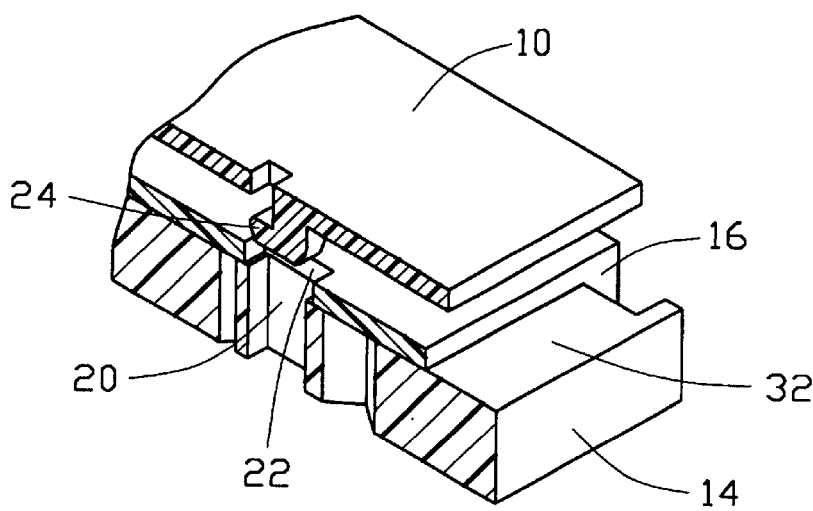
FIGS. 3–5 are cross-sectional views of the vacuum pick up cap and corresponding CPU socket, respectively showing positional relationship of the cap, the cover and the base.
Figure 4:
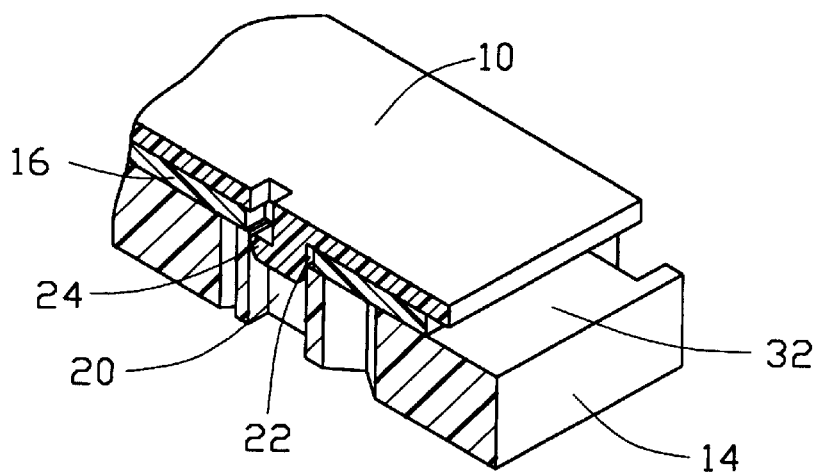
Figure 5:
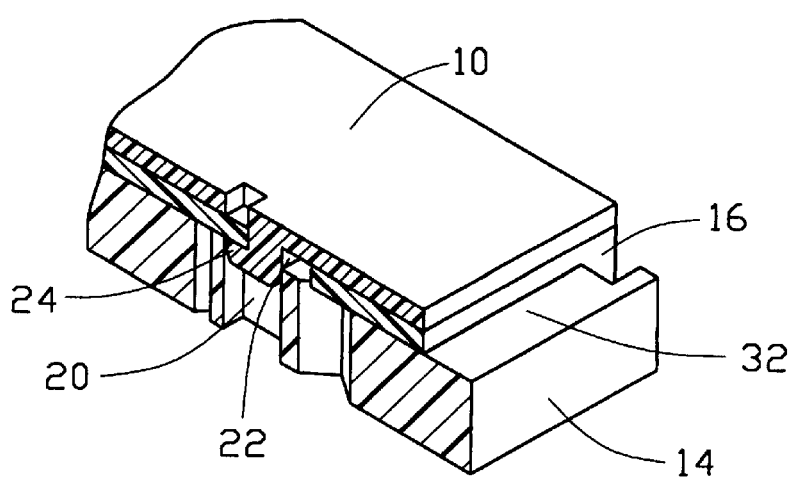
Figure 6:
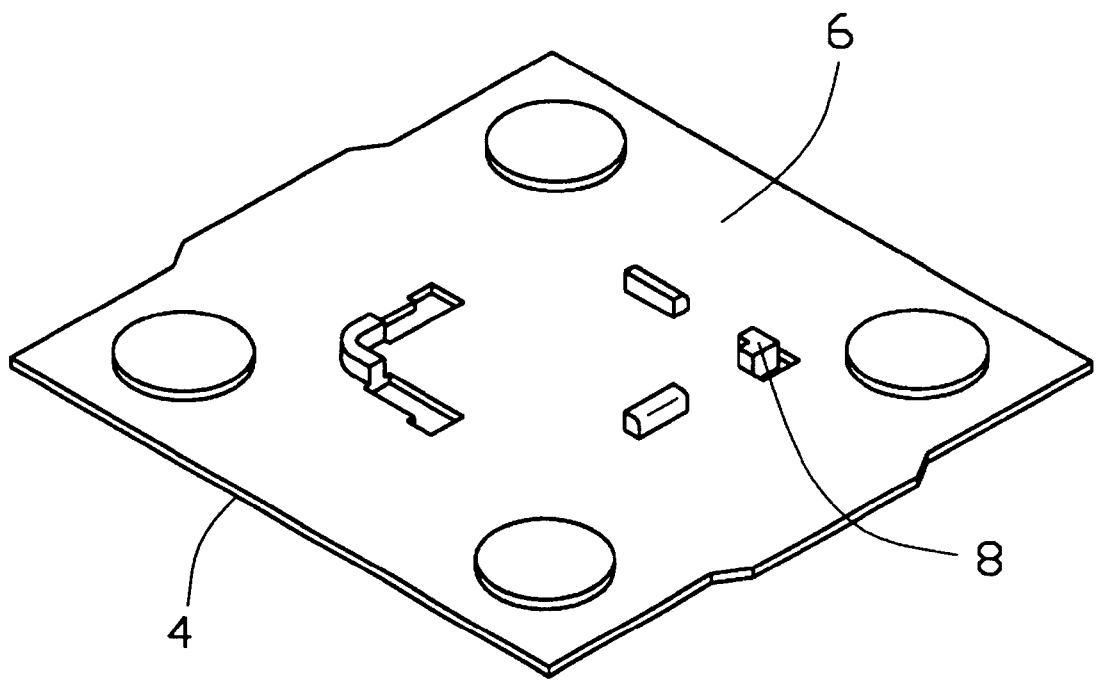
FIG. 6 is a perspective view of a vacuum pick up cap in the prior art.

Referring to FIGS. 3–5, the CPU socket 12 includes a base 14, a cover 16 stacked on the base 14, and a driving arm 18 between the base 14 and the cover 16. In this embodiment, the base 14 defines four openings 20, and the cover 16 defines four corresponding through-holes 22.

Figure 2:
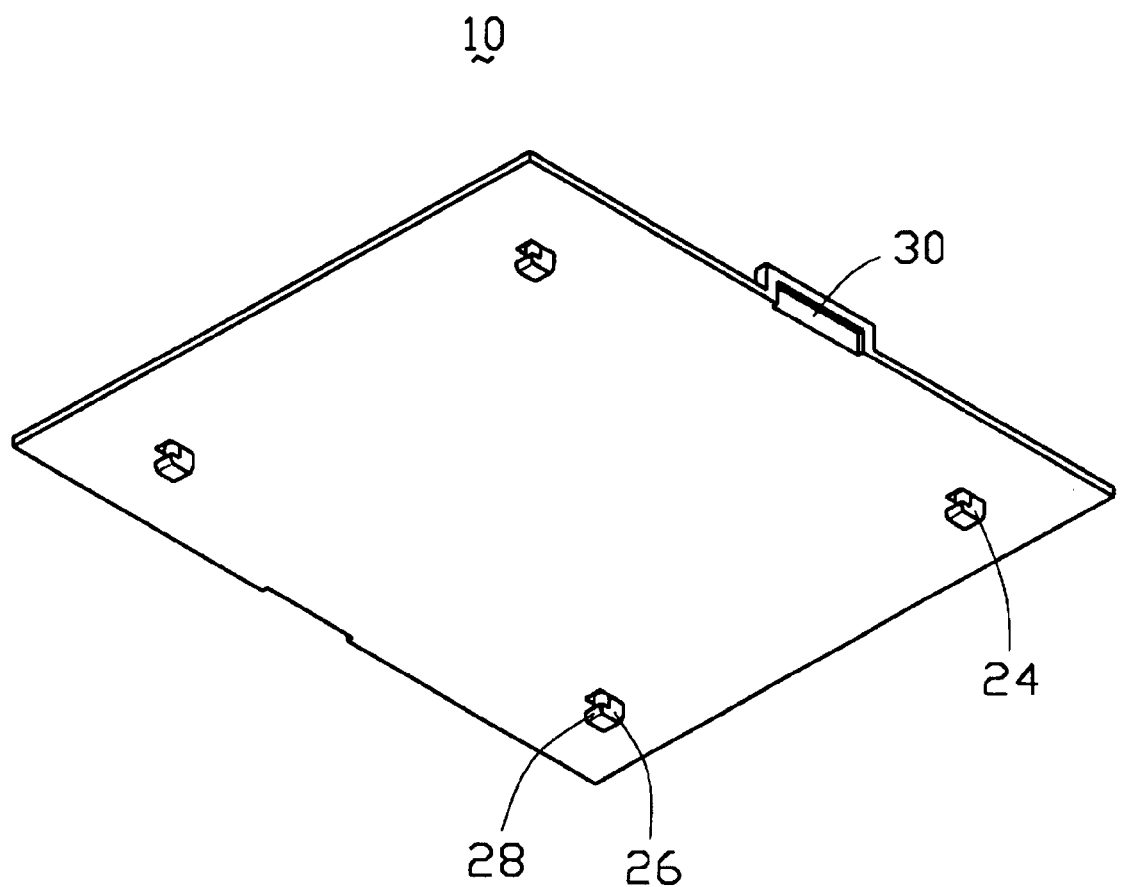
FIG. 2 is a bottom perspective view of the vacuum pick up cap.

Referring to FIG. 2, the vacuum pick up cap 10 defines a flat surface for vacuum suction, and comprises four legs 24 each having a body 26 and a projection 28 perpendicularly or laterally extending from the body 26, and a pair of latches 30. The latches 30 are positioned on both sides of the vacuum pick up cap 10 for facilitating assemblage. The four legs 24 are defined adjacent to four corners of the vacuum pick up cap 10, respectively. In addition, all projections 28 extend toward the same direction.

In addition, the driving arm 18 can be selectively operated from a closed position to an open position or from the open portion to the closed position, whereby the cover 16 can slide along an upper surface 32 of the base 14 from one side to the other side. Further the through-holes 22 of the cover 16 partially or completely overlap the corresponding openings 20 of the base 14. Sizes of the opening 20 and the through-hole 22 must be enough large so that the projection 28 can be fitted in the opening 20 and the through-hole 22.

In assembly, firstly the through-hole 22 is completely overlapping the opening 20, then the leg 24 is inserted through the through-hole 22 and into the opening 20. Subsequently, the cover 16 slides along the upper surface 32 of the base 14 to make the through-hole 22 partially overlap the opening 20, so that the through-hole 22 of the cover 16 engages with the projection 28 of the leg 24. Finally, the vacuum pick up cap 10 is positioned on the cover 10 and is assembled with the CPU socket 12 together. A vacuum device (not shown) to suck the vacuum pick up cap 10 and therefore the CPU socket 12.

It is noted that the open and closed positions may be normally referred to the general ZIF (zero insertion force) socket where the cover is moved to an open position for allowing CPU to be ZIF insertion and is moved to a closed position for firm engagement between the socket contacts and the CPU pins. Understandably, because the instant invention only relates to installation of the pick-up cap to the socket, such depicting definitions for the closed and open positions may have their own way without concerning about or complying with what refers to the socket contacts.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket assembly comprising:
   a base having an opening therein;
   a cover having a through-hole and slidably stacked on an upper surface of the base to be moveable between an open position and a closed position; and
   a vacuum pick up cap comprising a flat surface covering said cover for vacuum suction, and a leg extending downwardly from said flat surface through the through-hole and into the opening in said open position and being retained in the opening by a periphery of the through-hole in said closed position.

2. The socket assembly as described in claim 1, wherein the leg of the pick up cap includes a body and a projection laterally extending from the body.

3. The socket assembly as described in claim 2, wherein the body is received in the through-hole, and the projection is received in the opening and is prevented from an upward movement by the periphery of the through-hole.

4. The socket assembly as described in claim 1, further comprising a pair of latches.

5. A socket assembly comprising:
a base defining an opening therein;
a cover slidably mounted on said base and defining a through hole therein; and
a vacuum pick-up cap mounted onto said socket with a flat surface covering said cover for vacuum suction and with a hooked leg freely extending downwardly from said flat surface through said through hole when said cover is in a first position and latchably engaged with the one of said base and said cover when said cover is in a second position.

6. The socket assembly as described in claim 5, wherein the base is adapted to be mounted on a printed circuit board in a vertical direction, the cover is seated upon the base in said vertical direction, and the cap is seated upon the cover in said vertical direction.

7. The assembly as described in claim 6, wherein said hooked leg is latched with said cover.

8. A method of ZIF mounting a vacuum pick up cap to a socket connector, comprising the steps of:
providing a socket having a base and a cover slidably mounted on the base;
providing a vacuum pick up cap having a plate from which at least one hooked leg downwardly extends, the plate being adapted for subjecting to a vacuum suction; and
installing said vacuum pick up cap onto said socket under an initial condition that the hooked leg freely downwardly extends toward the base when said cover is in a first position with regard to the base, and then under a successive condition that the hooked leg is latchably engaged with at least one of said cover and said base in an upward direction when said cover is in a second position with regard to the base.

9. The method as described in claim 8, wherein said cover defines a through hole and said base defines an opening, and said leg extends through said through hole and into said opening.

10. The method as described in claim 8, wherein said pick up cap is static relative to the base of the socket when said cover is moved from the first position to the second position.

* * * * *